United States Patent
Mutnury et al.

(10) Patent No.: US 9,772,913 B1
(45) Date of Patent: Sep. 26, 2017

(54) SYSTEM AND METHOD OF READ/WRITE CONTROL FOR DUAL CHANNEL MEMORY MODULES FOR ROBUST PERFORMANCE

(71) Applicant: DELL PRODUCTS, LP, Round Rock, TX (US)

(72) Inventors: Bhyrav M. Mutnury, Round Rock, TX (US); Stuart Allen Berke, Austin, TX (US); Vadhiraj Sankaranarayanan, Austin, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 15/446,447

(22) Filed: Mar. 1, 2017

Related U.S. Application Data

(63) Continuation-in-part of application No. 15/331,064, filed on Oct. 21, 2016.

(51) Int. Cl.
*G11C 8/00* (2006.01)
*G06F 11/20* (2006.01)

(52) U.S. Cl.
CPC ........ *G06F 11/201* (2013.01); *G06F 11/2017* (2013.01)

(58) Field of Classification Search
CPC ........... G11C 16/08; G11C 16/10; G11C 8/08; G11C 8/10
See application file for complete search history.

(56) References Cited

U.S. PATENT DOCUMENTS

| | | | |
|---|---|---|---|
| 6,819,577 B1 | 11/2004 | Wiktor et al. | |
| 7,368,959 B1 | 5/2008 | Xu et al. | |
| 7,603,498 B2 | 10/2009 | Bishnoi et al. | |
| 8,489,775 B2 | 7/2013 | Berke et al. | |
| 2009/0190427 A1* | 7/2009 | Brittain | G06F 13/1684 365/212 |
| 2009/0190429 A1* | 7/2009 | Brittain | G06F 1/3203 365/233.1 |
| 2010/0082967 A1 | 4/2010 | Lo | |
| 2012/0023262 A1 | 1/2012 | Berke et al. | |
| 2014/0192583 A1* | 7/2014 | Rajan | G11C 7/10 365/63 |

(Continued)

OTHER PUBLICATIONS

U.S. Appl. No. 15/331,064, filed Oct. 21, 2016.

(Continued)

*Primary Examiner* — Tuan T Nguyen
(74) *Attorney, Agent, or Firm* — Larson Newman, LLP

(57) ABSTRACT

A memory controller for dual-channel DDR DIMMs comprises a first memory channel configured to execute a first memory transaction with a first memory device of a dual-channel DDR DIMM, and a second memory channel configured to execute a second memory transaction with a second memory device of the dual-channel DDR DIMM. The memory controller is configured to determine that the first memory channel is experiencing a degraded performance level in executing the first memory transaction with the first device, and to prevent read-write memory transactions and write-read memory transactions on the first and second memory channels in response to determining that the first memory channel is experiencing the degraded performance level.

20 Claims, 4 Drawing Sheets

(56) References Cited

U.S. PATENT DOCUMENTS

2015/0078104 A1   3/2015  Brandl et al.
2016/0118121 A1   4/2016  Kelly et al.

OTHER PUBLICATIONS

U.S. Appl. No. 15/276,240, filed Sep. 21, 2016.
XED: Exposing On-Die Error Detection Information for Strong Memory Reliability, Prashant J. Nair et al., ISCA-43, Jun. 20, 2016, pp. 1-13.

* cited by examiner

SYSTEM AND METHOD OF READ/WRITE CONTROL FOR DUAL CHANNEL MEMORY MODULES FOR ROBUST PERFORMANCE

CROSS REFERENCE TO RELATED APPLICATIONS

This application is a continuation-in-part of U.S. patent application Ser. No. 15/331,064, entitled "System and Method of Training Optimization for Dual Channel Memory Modules," filed on Oct. 21, 2016, the disclosure of which is hereby expressly incorporated by reference in its entirety.

FIELD OF THE DISCLOSURE

This disclosure generally relates to information handling systems, and more particularly relates to read/write control for dual channel memory modules for robust performance in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A memory controller for dual-channel DDR DIMMs may include a first memory channel and a second memory channel. The first memory channel may be configured to execute a first memory transaction with a first memory device of a dual-channel DDR DIMM. The second memory channel may be configured to execute a second memory transaction with a second memory device of the dual-channel DDR DIMM. The memory controller may be configured to determine that the first memory channel is experiencing a degraded performance level in executing the first memory transaction with the first device, and to prevent read-write memory transactions and write-read memory transactions on the first and second memory channels in response to determining that the first memory channel is experiencing the degraded performance level.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
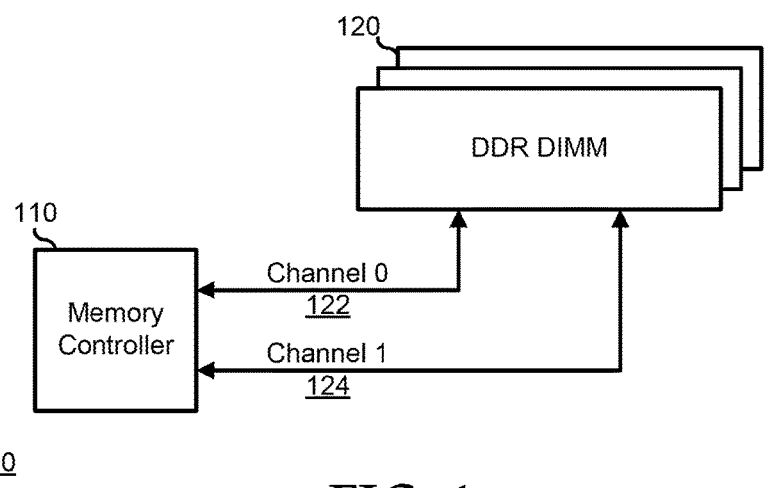
FIG. 1 is a block diagram of a dual channel double data rate (DDR) dual in-line memory module (DIMM) memory channel according to an embodiment of the present disclosure.

FIG. 1 illustrates a memory channel 100 for an information handling system. For the purpose of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Figure 2:
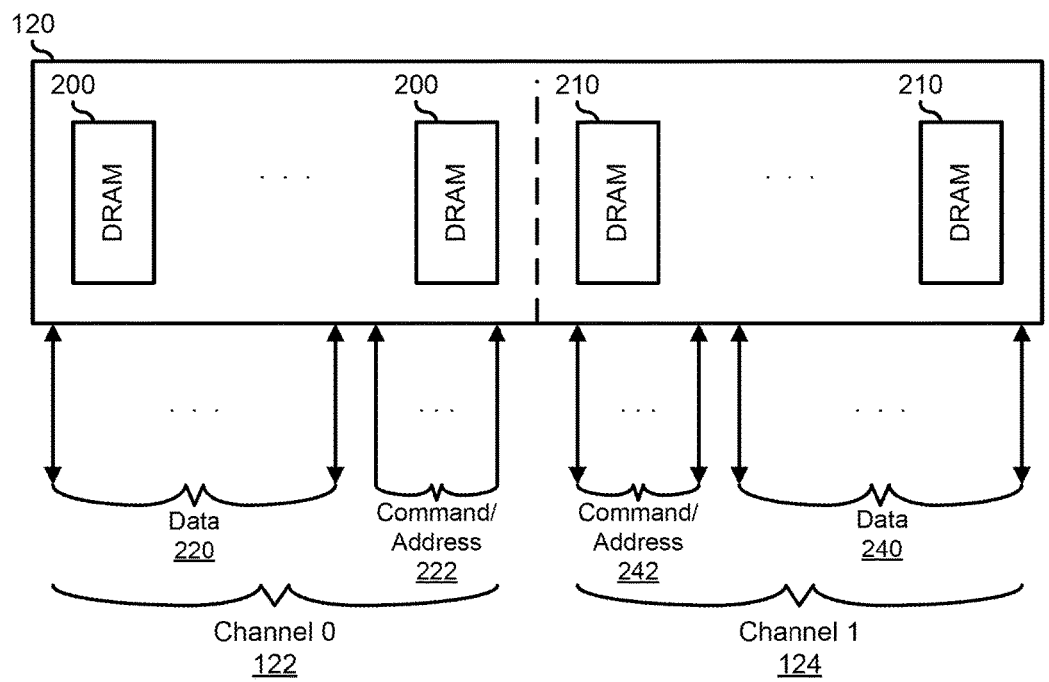
FIG. 2 is a block diagram of a dual channel DDR DIMM of FIG. 1.

Memory channel 100 includes a memory controller 110 and one or more dual channel—double data rate (DDR) dual in-line memory modules (DIMMs) 120. Dual channel DDR DIMMs 120 represent a memory device technology that includes two separate memory channels, channel 0 122, and channel 1 124. FIG. 2 illustrates a typical dual channel DDR DIMM 120 that is organized into a first set of dynamic random access memory (DRAM) 200 and a second set of DRAM 210. Here, channel 0 122 is associated with DRAM 200 and channel 1 124 is associated with DRAM 210. As such, channel 0 122 includes a channel 0 data bus 220 that represents half of the data lines to dual channel DDR DIMM 120, and a command/address (C/A) bus 222 for controlling data transactions with DRAM 200. Similarly, channel 1 124 includes a channel 1 data bus 240 that represents the other half of the data lines to dual channel DDR DIMM 120, and a C/A 242 for controlling data transactions with DRAM 210. In particular, where dual channel DDR DIMM 120 is a 64-bit memory device, channel 0 122, data bus 220 represents 32-bits of data stored on DRAM 200 and data bus 240 represents 32-bits of data stored on DRAM 210. It will be understood that data busses 220 and 240 can include error correcting code (ECC) bits as needed or desired, and that each data bus may therefore represent, for example, 36-bits of data; 32-bits of data and 4-bits of ECC data. Note that other data bus arrangements may be utilized, as needed or desired, such as where a DRAM includes 8-bits of ECC data, another number of bits of ECC data, or no ECC data bits.

Each of DRAM banks 200 and 210 are separately accessible for data transactions with memory controller 110. In particular, memory controller 110 can issue memory reads simultaneously to both of DRAM banks 200 and 210, can issue memory writes to both DRAM banks, can issue a memory read to a one DRAM bank while simultaneously issuing a memory write to the other DRAM bank, can issue a memory read to one DRAM bank while the other DRAM bank is idle, or can issue a memory write to one DRAM bank while the other DRAM bank is idle. As such, while the data lines are two data busses 220 and 240 that are each 32-bits wide, each of DRAM banks 200 and 210 needs its own associated C/A bus 222 and 242, respectively, to control the data transactions with the associated DRAM banks. As such, memory channel 100 represents a memory channel for a DDR memory standard beyond the present DDR synchronous dynamic random access memory (SDRAM) standards, such as the Joint Electron Device Engineering Council (JEDEC) DDR-200 standard, DDR-266 standard, the DDR-333 standard, or the DDR-400A/B/C standard. In particular, memory channel 100 represents a fifth or greater generation DDR memory channel, such as a DDR memory channel in accordance with a future DDR5 standard, or beyond.

Memory controller 110 operates to train channels 122 and 124 when the devices associated with memory channel 100 are powered on. However, training of memory channel 100 represents challenges to the maintenance of high signal integrity beyond those faced by single channel memory devices. This is because, in training single channel memory devices, a simple process of training all C/A lines together, training all data lines together for write operations, and training all data lines together for read operations, is insufficient to train for the cross-talk and noise effects for all of the data transaction modes associated with dual channel DDR DIMM 120. In particular, merely training C/A busses 222 and 242 together fails to adequately cover the training needs for cases where one C/A bus is active and the other C/A bus is idle. Also, performing write side training on both data busses 220 and 240 fails to adequately cover the training needs for cases where one data bus is performing a data write and the other data bus is performing a data read or is idle. Similarly, performing read side training on both data busses 220 and 240 fails to adequately cover the training needs for cases where one data bus is performing a data read and the other data bus is performing a data write or is idle.

As such, memory controller 110 operates to train channels 122 and 124 in the various transaction modes. In particular, memory controller 110 initiates a training mode for training C/A busses 222 and 242, whereby the C/A busses are trained with both busses active, referred to as C/A active-active training, then with each C/A bus active while the other C/A bus is idle, referred to as C/A active-idle training. Memory controller 110 further initiates another training mode for write training of data busses 220 and 240, whereby the data busses are trained with both data busses performing write data transactions, referred to as data write-write training, with each data bus performing a write data transaction while the other data bus is performing a read data transaction, referred to as data write-read training, and with each data bus performing a write data transaction while the other data bus is idle, referred to as data write-idle training. Finally, memory controller 110 initiates another training mode for read training of data busses 220 and 240, whereby the data busses are trained with both data busses performing read data transactions, referred to as data read-read training, with each data bus performing a read data transaction while the other data bus is performing a write data transaction, referred to as data read-write training, and with each data bus performing a read data transaction while the other data bus is idle, referred to as data read-idle training.

Note that the order in which memory controller 110 initiates the training modes, and the order in which the memory controller performs the individual trainings within the training modes, may be different from the order as described herein, as needed or desired. Further note that for each training mode, memory controller 110 may derive separate training parameters for each training performed. As such, in a particular embodiment, memory controller 110 further operates to consolidate the write training parameters into a single "best fit" training parameter that takes a numerical average value for each of the parameters generated by a particular trainings, and then applies the best fit parameter to during normal operations. In another embodiment, memory controller 110 operates to consolidate the write training parameters into a "worst case" training parameter by applying the one worst case training parameter in all cases during normal operation. In another embodiment, memory controller 110 operates to recall each training parameter generated by each training, and applies that training parameter when the data transaction mode matches the particular training mode that generated the training parameter. For example, where a particular training parameter is generated during a data read-write training, where data bus 220 is performing a data read transaction and data bus 240 is performing a data write transaction, then, during normal operations, when data bus 220 performs a data read transaction simultaneously with data bus 240 performing a data write transaction, then memory controller 110 can operate to provide that particular training parameter to the transaction.

The C/A training can include C/A signal alignment with a clock signal, and an associated C/A training parameter can include a delay pre-set for sending C/A signals on the C/A busses. The write training can include write leveling to align a data strobe (DQS) on the data busses with a clock signal, and write training to align the data strobe DQS with the write data signals on the data busses. As such, the associated write training parameters can include a delay pre-set for sending the data strobe DQS on the data busses and a delay pre-set for sending the data on the data busses. The read training can include read leveling to align the memory controller with the data read preamble, and read training to align the DQS on with the read data signals on the data busses. As such, the associated read training parameters can include a delay pre-set for the read data preamble and a delay pre-set for receiving the read data on the data busses.

Figure 3:
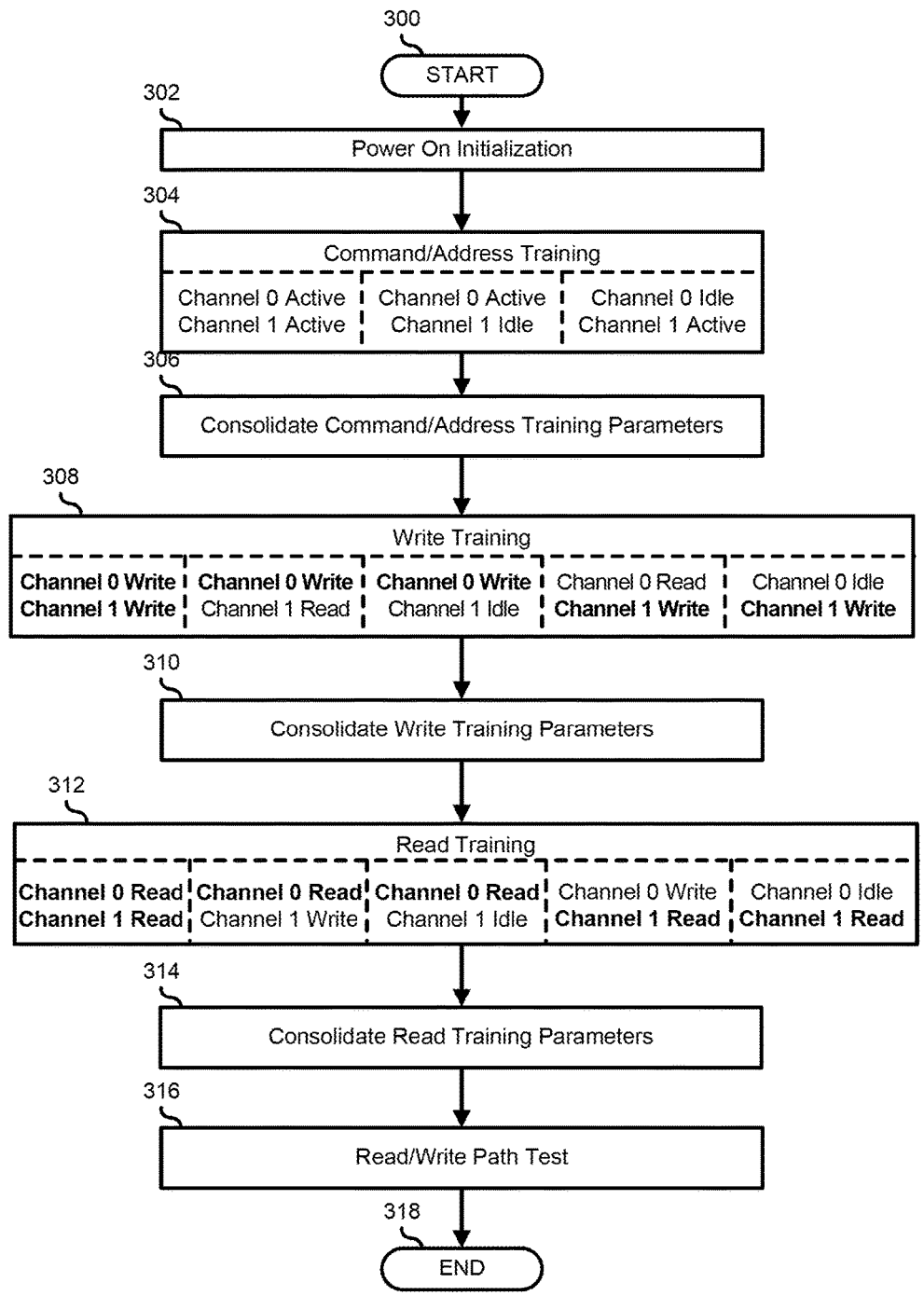
FIG. 3 is a flowchart illustrating a method of training optimization for dual channel DDR DIMMs according to an embodiment of the present disclosure.

FIG. 3 illustrates a method of training optimization for dual channel DDR DIMMs starting at block 300. A memory channel is powered on and initialized in block 302. For example, the devices that make up memory channel 100 can be powered on, and the memory channel can be initialized according, for example, to a JEDEC power-on specification for the memory channel. The memory controller of the memory channel initiates C/A training in block 304. The C/A training includes C/A active-active training with both C/A busses of the dual channel DDR DIMM active, C/A active-idle training with the channel 0 C/A bus active and the channel 1 C/A bus idle, and C/A active-idle training with the channel 1 C/A bus active and the channel 0 C/A bus idle. The C/A training parameters are consolidated into a single training parameter for use in normal operations in block 306. For example, memory controller 110 can utilize a best fit training parameter, a worst case training parameter, or a combination of best fit and worst case training parameters as needed or desired.

The memory controller initiates write training in block 308. The write training includes write-write training with both data busses performing write transactions, write-read training with the channel 0 data bus performing a data write transaction while the channel 1 data bus performs a data read transaction, write-idle training with the channel 0 data bus performing a data write transaction while the channel 1 data bus is idle, read-write training with the channel 1 data bus performing a data write transaction while the channel 0 data bus performs a data read transaction, and idle-write training with the channel 1 data bus performing a data write transaction while the channel 0 data bus is idle. The write training parameters are consolidated into a single training parameter for use in normal operations in block 310. Again, memory controller 110 can utilize a best fit training parameter, a worst case training parameter, or a combination of best fit and worst case training parameters as needed or desired.

The memory controller initiates read training in block 312. The read training includes read-read training with both data busses performing read transactions, read-write training with the channel 0 data bus performing a data read transaction while the channel 1 data bus performs a data write transaction, read-idle training with the channel 0 data bus performing a data read transaction while the channel 1 data bus is idle, write-read training with the channel 1 data bus performing a data read transaction while the channel 0 data bus performs a data write transaction, and idle-read training with the channel 1 data bus performing a data read transaction while the channel 0 data bus is idle. The read training parameters are consolidated into a single training parameter for use in normal operations in block 310. Again, memory controller 110 can utilize a best fit training parameter, a worst case training parameter, or a combination of best fit and worst case training parameters as needed or desired. Read and write path testing is performed by the memory controller to further refine of calibrate the memory channel, as needed or desired, in block 316, and the method ends in block 318. Note that the method as shown in FIG. 3 is repeated for each dual channel DDR DIMM in a memory channel.

Figure 4:
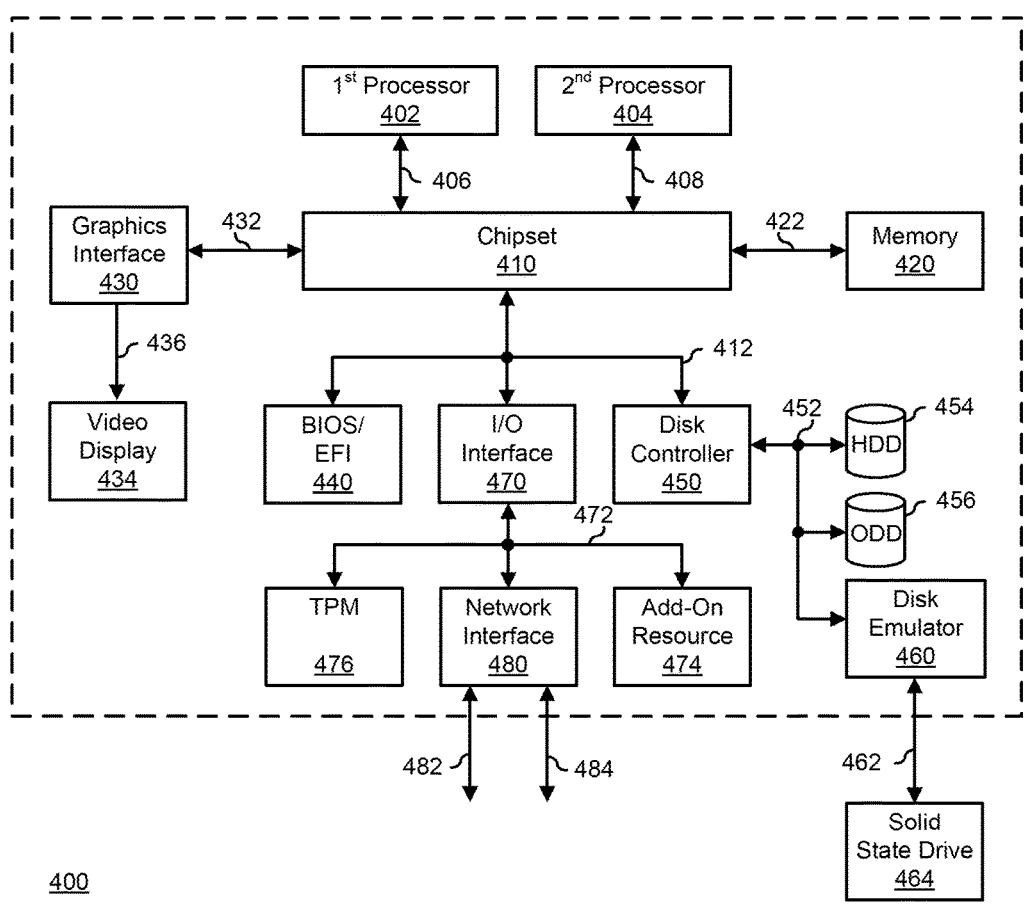
FIG. 4 is a block diagram illustrating a generalized information handling system according to an embodiment of the present disclosure.

In a particular embodiment, a DDR DIMM is configured that include more than two memory channels. Here, channel training for the DDR DIMM will include multiple write and read training modes, as needed or desired. For example, where a DDR DIMM includes three memory channels, the write training can include a write-write-write mode, a write-write-read mode, a write-write-idle mode, a write-read-write mode, a write-read-read mode, a write-read-idle mode, a write-idle-write mode, a write-idle-read mode, a write-idle-idle mode, and so on, to cover all possible combinations of write training modes. The DDR DIMM can also include all possible combinations of read training modes FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described above, and operates to perform one or more of the methods described above. Information handling system 400 includes a processors 402 and 404, a chipset 410, a memory 420, a graphics interface 430, include a basic input and output system/extensible firmware interface (BIOS/EFI) module 440, a disk controller 450, a disk emulator 460, an input/output (I/O) interface 470, and a network interface 480. Processor 402 is connected to chipset 410 via processor interface 406, and processor 404 is connected to the chipset via processor interface 408. Memory 420 is connected to chipset 410 via a memory bus 422. Graphics interface 430 is connected to chipset 410 via a graphics interface 432, and provides a video display output 436 to a video display 434. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, initialize the resources, and access the resources. BIOS/EFI module 440 includes code that operates to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474, to a TPM 476, and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as chipset 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Returning to FIG. 1, in a particular embodiment channel 0 122 and channel 1 124 each include one or more ECC bits that permit the detection and correction of bit errors in the transmission of data between memory controller 110 and DDR DIMM 120. For example, channel 0 122 and channel 1 124 can each include 4-bits of ECC data, 8-bits of ECC data, or another number of bits of ECC data. In a particular embodiment, memory controller 110 and DDR5 DIMM 120 are configured to keep track of the number of bit errors that are detected, and to determine a bit error rate (BER) for channel 0 122 and channel 1 124. Moreover, memory controller 110 and DDR DIMM 120 each include a BER threshold setting, such that when the BER of one of channel 0 122 and channel 1 124 exceeds the BER threshold setting (that is, the number of bit errors detected in a given time window exceeds a certain amount) a warning indication of the performance degradation on the affected channel can be provided.

In the case of memory controller 110, the performance degradation of one of channel 0 122 or channel 1 124 on memory reads are directly detected, because the read errors occur and are counted in the memory controller. However, the performance degradation of one of channel 0 122 or channel 1 124 on memory writes, being detected by DDR DIMM 120, may not be as directly detectable to memory controller 110. For example, in embodiments where the command/address busses are unidirectional (that is, where the command and address information is provided from memory controller 110 to DDR DIMM 120 and the command/address busses do not include any capability for bi-directional communication) DDR DIMM 120 will place an indication in a register that is accessible to memory controller 110 to indicate the degradation of performance on the effected channel 0 122 or channel 1 124 (that is, that a BER for the channel has exceeded the BER threshold setting). In this case, memory controller 110 will poll DDR DIMM 120 to read the register in order to obtain the indication that one of channel 0 122 and channel 1 124 is experiencing degraded performance. An example of a readable register may include a register that is accessible via the Serial Presence Detection (SPD) mechanism over an I2C interface between memory controller 110 and DDR DIMM 120. In another embodiment, the command/address busses include a capability for bi-directional communication. Here, DDR DIMM 120 directly indicates that one of channel 0 122 and channel 1 124 is experiencing degraded performance to memory controller 110 by providing the indication as information on one of the command/address busses back to the memory controller.

Under normal operation, that is, when both channel 0 122 and channel 1 124 are operating with BERs that are below the BER threshold setting, memory controller 110 operates to independently schedule memory transactions on channel 0 and on channel 1. Here, memory controller 110 is at liberty to schedule reads, writes, and idle cycles at will. For example, memory controller 100 can schedule read-read transactions, read-write transactions, read-idle transactions, write-write transactions, write-read transactions, or write-idle transactions, as needed or desired.

However, when one of channel 0 122 and channel 1 124 experiences degraded performance, memory controller 100 provides transaction dependent scheduling of memory transactions on channel 0 and channel 1. In particular, it may be assumed that read-read transactions, read-idle transactions, write-write transactions, and write-idle transactions do not contribute as much to an increase in BER on a channel than do read-write transactions and write-read transactions, because the misaligned data flow directions in the read-write transactions and the write-read transactions may result in greater cross-talk between the channels. Thus, in a particular embodiment, when one of channel 0 122 or channel 1 124 experiences degraded performance, memory controller 110 operates to restrict the permitted transactions to read-read transactions, read-idle transactions, write-write transactions, and write-idle transactions only, and to prevent read-write transactions and write-read transactions. In this way, the BER on the affected channel can improve because the worst-case transactions are not allowed.

In a particular embodiment, memory controller 110 resumes independent scheduling of memory transactions on channel 0 122 and channel 1 124 after a predetermined duration of time. In a particular embodiment, the BER threshold setting, and the duration of time are user configurable by, for example, setting options in a platform BIOS. In another embodiment, memory controller 110 and DDR DIMM 120 operate to continue monitoring the BER of channel 0 122 and channel 1 124 to determine if the channel with the degraded performance has experienced an improvement in performance in response to the dependent memory transaction scheduling the memory controller. Such an improvement in performance is detected by a decrease in the BER to a level that is below the BER threshold setting. When the affected channel 0 122 or channel 1 124 experiences an improvement in the performance, memory controller 110 will directly detect the improvement for memory read transactions, as described above, and DDR DIMM 120 will detect the improvement for memory write transactions, and provide an indication to the memory controller, as described above. Then, in response to the improvement in performance of the affected channel 0 122 or channel 1 124, memory controller 110 resumes the independent scheduling of memory transactions on channel 0 and channel 1.

In another embodiment, when one of memory channel 0 122 or channel 1 124 experiences degraded performance, memory controller 110 provides failure aware dependent memory transaction scheduling of memory transactions on channel 0 and channel 1. Here, the direction of memory transactions associated with the degraded performance is taken into account when scheduling memory transactions. Thus, if the degraded performance is on one of channel 0 122 and channel 1 124 for memory reads, only, then memory controller 110 will continue to schedule write-read transactions on the affected channel, but will not schedule read-write transactions on the affected channel. For example, consider where channel 0 122 is detected to have experienced degraded write performance, that is, that DDR DIMM 120 detected the performance degradation. Here, memory controller 110 will continue to issue read transactions on channel 0 122 in conjunction with write transactions on channel 1 124, but will not schedule write transactions on channel 0 in conjunction with read transactions on channel 2. Note further, that here, the failure aware dependent memory transaction scheduling can also take into consideration where more than one DDR DIMM is provided on channel 0 122 and channel 1 124. Here, the memory controller can identify a particular degraded DDR DIMM, and only provide dependent memory transaction scheduling for the degraded DDR DIMM, and, for the non-degraded DDR DIMM, the memory controller can continue to provide independent memory transaction scheduling.

Figure 5:
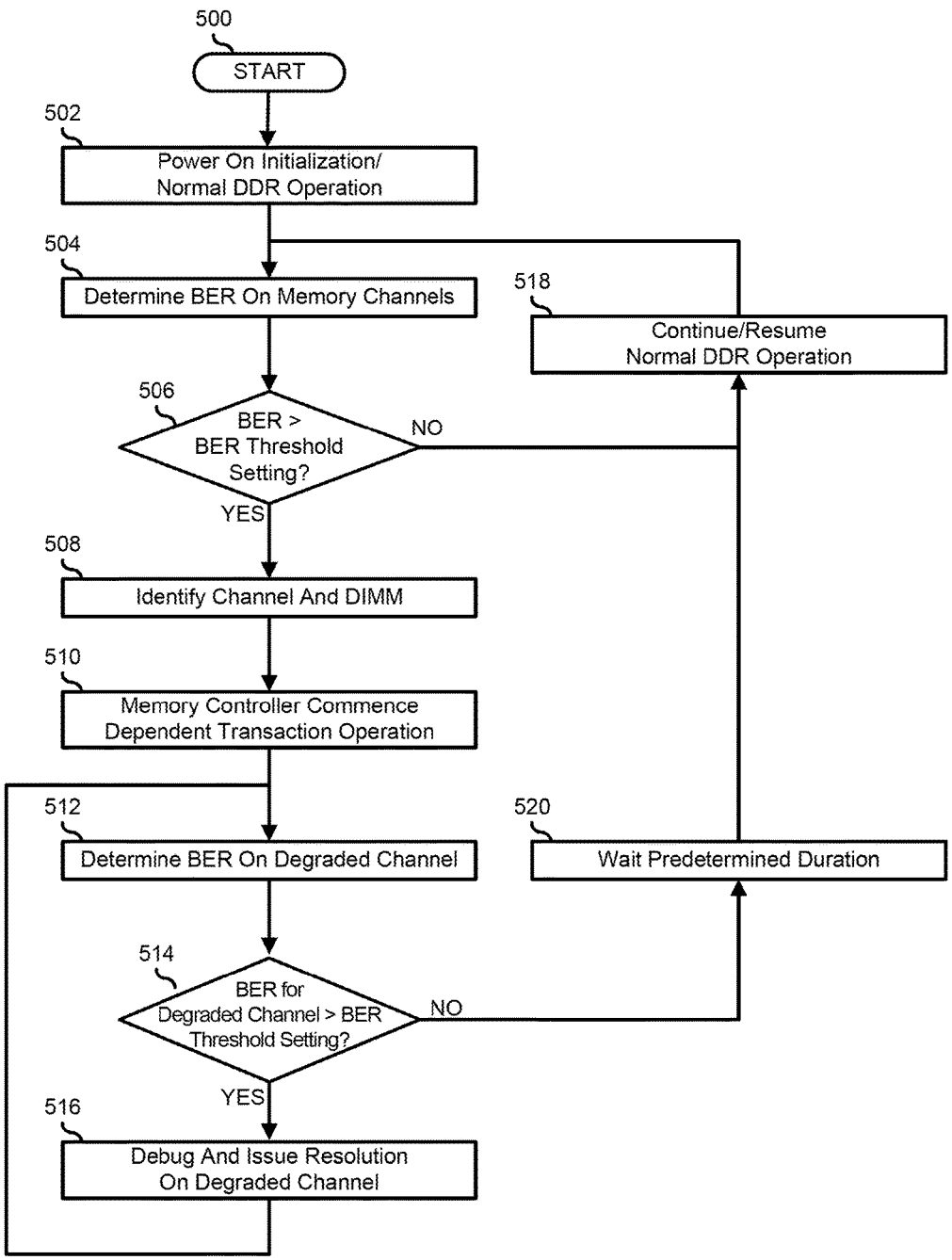
FIG. 5 is a flowchart illustrating a method for read/write control for dual channel memory modules for robust performance.

FIG. 5 is illustrates a method for read/write control for dual channel memory modules for robust performance, starting at block 500. A memory controller for dual-channel DDR DIMMs on an information handling system is powered on, the memory channels associated with the memory controller are initialized, and normal DDR memory operation is commenced on the dual-channel DDR DIMMs in block 502. The memory controller and the DDR DIMMs determine a BER for the memory channels in block 504. A decision is made as to whether or not the BER for either channel exceeds a BER threshold setting in decision block 506. If not, the "NO" branch of decision block 506 is taken, the normal DDR memory operation is continued in block 518, and the method returns to block 504, where the memory controller and the DDR DIMMs determine the BER for the memory channels. If the BER for either channel exceeds the BER threshold setting, the "YES" branch of decision block 506 is taken and the channel and DIMM with the degraded performance is identified in block 508.

The memory controller commences failure aware dependent memory transaction scheduling operation on the DDR DIMMs on the memory channels in block 510. The memory controller and the DDR DIMMs then determine the BER for the degraded memory channel in block 512. A decision is made as to whether or not the BER for the degraded channel exceeds the BER threshold setting in decision block 514. If not, the "NO" branch of decision block 514 is taken, a predetermined wait time is allowed to run, the normal DDR memory operation is resumed in block 518, and the method returns to block 504, where the memory controller and the DDR DIMMs determine the BER for the memory channels. If the BER for the degraded channel exceeds the BER threshold setting, the "YES" branch of decision block 514 is taken, a channel debug and issue resolution process is provided for the degraded channel in block 516, and the method returns to block 512 where the memory controller and the DDR DIMMs then determine the BER for the degraded memory channel.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory controller for dual-channel double data rate (DDR) dual in-line memory modules (DIMMs), the memory controller comprising:
a first memory channel configured to execute a first memory transaction with a first memory device of a dual-channel DDR DIMM; and
a second memory channel configured to execute a second memory transaction with a second memory device of the dual-channel DDR DIMM;
wherein the memory controller is configured to:
determine that the first memory channel is experiencing a degraded performance level in executing the first memory transaction with the first device; and
in response to determining that the first memory channel is experiencing the degraded performance level, to prevent read-write memory transactions and write-read memory transactions on the first and second memory channels.

2. The memory controller of claim 1, wherein, subsequent to determining that the first memory channel is experiencing the degraded performance level, the memory controller is further configured to:
determine that the first memory channel is experiencing a normal performance level in executing a second memory transaction with the first device; and
in response to determining that the first memory channel is experiencing the normal performance level, to allow read-write memory transactions and write-read memory transactions on the first and second memory channels.

3. The memory controller of claim 2, wherein in determining that the first memory channel is experiencing the degraded performance level, the memory controller is further configured to:
determine a first bit error rate (BER) associated with read memory transactions on the first memory channel; and
determine that the first BER exceeds a BER threshold setting.

4. The memory controller of claim 3, wherein in determining that the first memory channel is experiencing the normal performance level, the memory controller is further configured to:
determine a second BER associated with the read memory transactions on the first memory channel; and
determine that the second BER is less than the BER threshold setting.

5. The memory controller of claim 2, wherein in determining that the first memory channel is experiencing the degraded performance level, the memory controller is further configured to:
receive an indication from the dual-channel DDR DIMM that a first bit error rate (BER) associated with write memory transactions on the first memory channel exceeds a BER threshold setting.

6. The memory controller of claim 5, wherein in determining that the first memory channel is experiencing the normal performance level, the memory controller is further configured to:
receive a second indication from the dual-channel DDR DIMM that a second BER associated with the write memory transactions on the first memory channel is less than the BER threshold setting.

7. The memory controller of claim 2, wherein in allowing the read-write memory transactions and the write-read memory transactions on the first and second memory channels, the memory controller is further configured to:
wait a predetermined duration between determining that the first memory channel is experiencing the normal performance and allowing the read-write memory transactions and the write-read memory transactions on the first and second memory channels.

8. The memory controller of claim 1, wherein in further response to determining that the first memory channel is experiencing the degraded performance level, the memory controller is further configured to:
allow read-read memory transactions, read-idle memory transactions, write-write memory transactions, and write-idle memory transactions on the first and second memory channels.

9. A method for controlling dual-channel double data rate (DDR) dual in-line memory modules (DIMMs), the method comprising:
configuring a first memory channel of a memory controller to execute a first memory transaction with a first memory device of a dual-channel DDR DIMM;
configuring a second memory channel of the memory controller to execute a second memory transaction with a second memory device of the dual-channel DDR DIMM;
determining, by the memory controller, that the first memory channel is experiencing a degraded performance level in executing the first memory transaction with the first device; and
preventing, by the memory controller, read-write memory transactions and write-read memory transactions on the first and second memory channels in response to determining that the first memory channel is experiencing the degraded performance level.

10. The method of claim 9, further comprising:
determining, by the memory controller, that the first memory channel is experiencing a normal performance level in executing a second memory transaction with the first device subsequent to determining that the first memory channel is experiencing the degraded performance level; and
allowing, by the memory controller, read-write memory transactions and write-read memory transactions on the first and second memory channels in response to determining that the first memory channel is experiencing the normal performance level.

11. The method of claim 10, wherein in determining that the first memory channel is experiencing the degraded performance level, the method further comprises:
determining, by the memory controller, a first bit error rate (BER) associated with read memory transactions on the first memory channel; and
determining, by the memory controller, that the first BER exceeds a BER threshold setting.

12. The method of claim 11, wherein in determining that the first memory channel is experiencing the normal performance level, the method further comprises:
determining, by the memory controller, a second BER associated with the read memory transactions on the first memory channel; and
determining, by the memory controller, that the second BER is less than the BER threshold setting.

13. The method of claim 9, wherein in determining that the first memory channel is experiencing the degraded performance level, the method further comprises:
receiving an indication from the dual-channel DDR DIMM that a first bit error rate (BER) associated with write memory transactions on the first memory channel exceeds a BER threshold setting.

14. The method of claim 13, wherein in determining that the first memory channel is experiencing the normal performance level, the method further comprises:
receiving a second indication from the dual-channel DDR DIMM that a second BER associated with the write memory transactions on the first memory channel is less than the BER threshold setting.

15. The method of claim 10, wherein in allowing the read-write memory transactions and the write-read memory transactions on the first and second memory channels, the method further comprises:
waiting a predetermined duration between determining that the first memory channel is experiencing the normal performance and allowing the read-write memory transactions and the write-read memory transactions on the first and second memory channels.

16. The method of claim 9, wherein in further response to determining that the first memory channel is experiencing the degraded performance level, the method further comprises:
allowing, by the memory controller, read-read memory transactions, read-idle memory transactions, write-write memory transactions, and write-idle memory transactions on the first and second memory channels.

17. An information handling system, comprising:
a dual-channel double data rate (DDR) dual in-line memory module (DIMM); and
a memory controller for dual-channel DDR DIMMs, the memory controller including a first memory channel configured to execute a first memory transaction with a first memory device of the dual-channel DDR DIMM, and a second memory channel configured to execute a second memory transaction with a second memory device of the dual-channel DDR DIMM, wherein the memory controller is configured to:
determine that the first memory channel is experiencing a degraded performance level in executing the first memory transaction with the first device; and
in response to determining that the first memory channel is experiencing the degraded performance level, to prevent read-write memory transactions and write-read memory transactions on the first and second memory channels.

18. The information handling system of claim 17, wherein, subsequent to determining that the first memory channel is experiencing the degraded performance level, the memory controller is further configured to:
determine that the first memory channel is experiencing a normal performance level in executing a second memory transaction with the first device; and
in response to determining that the first memory channel is experiencing the normal performance level, to allow read-write memory transactions and write-read memory transactions on the first and second memory channels.

19. The information handling system of claim 18, wherein in determining that the first memory channel is experiencing the degraded performance level, the memory controller is further configured to:
determine a first bit error rate (BER) associated with read memory transactions on the first memory channel; and
determine that the first BER exceeds a BER threshold setting.

20. The information handling system of claim 19, wherein in determining that the first memory channel is experiencing the normal performance level, the memory controller is further configured to:
determine a second BER associated with the read memory transactions on the first memory channel; and
determine that the second BER is less than the BER threshold setting.

* * * * *